US012800621B2

(12) United States Patent
Kim

(10) Patent No.: US 12,800,621 B2
(45) Date of Patent: Nov. 17, 2026

(54) VOLTAGE DETERMINATION CIRCUIT

(71) Applicant: LG ENERGY SOLUTION, LTD., Seoul (KR)

(72) Inventor: Tae Hoon Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 280 days.

(21) Appl. No.: 18/285,808

(22) PCT Filed: Oct. 28, 2022

(86) PCT No.: PCT/KR2022/016678
§ 371 (c)(1),
(2) Date: Oct. 5, 2023

(87) PCT Pub. No.: WO2023/080560
PCT Pub. Date: May 11, 2023

(65) Prior Publication Data

US 2024/0369603 A1 Nov. 7, 2024

(30) Foreign Application Priority Data

Nov. 4, 2021 (KR) ........................ 10-2021-0150442

(51) Int. Cl.
*G01R 19/165* (2006.01)
*G01R 31/3835* (2019.01)

(52) U.S. Cl.
CPC . *G01R 19/16542* (2013.01); *G01R 19/16519* (2013.01); *G01R 19/16595* (2013.01); *G01R 31/3835* (2019.01)

(58) Field of Classification Search
CPC ........ G01R 19/16542; G01R 19/16519; G01R 19/16595; G01R 31/383
See application file for complete search history.

(56) References Cited

U.S. PATENT DOCUMENTS 4,024,415 A 5/1977 Matsuura
4,037,399 A * 7/1977 Chihara ........... G01R 19/16519
340/636.11

(Continued)

FOREIGN PATENT DOCUMENTS

JP 2012-235669 A 11/2012
JP WO2015/181987 A1 12/2015

(Continued)

OTHER PUBLICATIONS

Extended European Search Report for European Application No. 22890293.8, dated Jan. 2, 2025.
Partial Supplementary European Search Report for European Application No. 22890293.8, dated Sep. 26, 2024.
International Search Report (PCT/ISA/210) issued in PCT/KR2022/016678 mailed on Feb. 6, 2023.

*Primary Examiner* — Walter L Lindsay, Jr.
*Assistant Examiner* — Milton Gonzalez
(74) *Attorney, Agent, or Firm* — Birch, Stewart, Kolasch & Birch, LLP

(57) ABSTRACT

According to an aspect of the present invention, there is provided a voltage determination circuit a voltage supply unit that supplies a predetermined voltage, a first switch that receives the supply voltage to switch according to a first threshold voltage, a second switch that receives the supply voltage to switch according to a second threshold voltage, and a third switch that receives an output of the second switch to switch according to a third threshold voltage.

14 Claims, 3 Drawing Sheets

(56) References Cited

U.S. PATENT DOCUMENTS

| | | | |
|---|---|---|---|
| 4,160,176 A | | 7/1979 | Takahashi |
| 4,309,627 A | * | 1/1982 | Tabata ............. G01R 19/16542 327/143 |
| 4,321,541 A | | 3/1982 | Nishizuka |
| 8,862,053 B2 | * | 10/2014 | Sato ................... G06K 19/0701 320/108 |
| 2011/0121870 A1 | * | 5/2011 | Morino .................. H03K 17/22 327/143 |
| 2015/0333541 A1 | | 11/2015 | Butzmann |
| 2016/0062383 A1 | * | 3/2016 | Nagasawa ................. G05F 3/24 307/130 |
| 2018/0038915 A1 | | 2/2018 | Ruiz Sevillano et al. |
| 2018/0172749 A1 | * | 6/2018 | Igarashi .................. G05F 1/625 |
| 2020/0127483 A1 | | 4/2020 | Kim et al. |
| 2021/0257676 A1 | | 8/2021 | Takahashi et al. |
| 2021/0325479 A1 | | 10/2021 | Ferre Fabregas et al. |

FOREIGN PATENT DOCUMENTS

| | | | |
|---|---|---|---|
| JP | 2018-140688 | A | 9/2018 |
| JP | 2019-184333 | A | 10/2019 |
| JP | 2021-36764 | A | 3/2021 |
| JP | 6938254 | B2 | 9/2021 |
| KR | 10-1744712 | B1 | 6/2017 |
| KR | 10-2018-0123834 | A | 11/2018 |
| KR | 10-2059076 | B1 | 2/2020 |
| KR | 10-2020-0034117 | A | 3/2020 |
| KR | 10-2021-0069396 | A | 6/2021 |
| KR | 10-2259413 | B1 | 6/2021 |
| KR | 10-2021-0092013 | A | 7/2021 |

* cited by examiner

VOLTAGE DETERMINATION CIRCUIT

CROSS-REFERENCE TO RELATED APPLICATIONS

This application is the National Phase of PCT/KR2022/016678 filed on Oct. 28, 2022, which claims priority under 35 U.S.C. § 119(a) to Patent Application No. 10-2021-0150442 filed in the Republic of Korea on Nov. 4, 2021, all of which are hereby expressly incorporated by reference into the present application.

TECHNICAL FIELD

The present invention relates to a voltage determination circuit, and more particularly, to a voltage determination circuit capable of determining whether or not a voltage output from a voltage supply unit is abnormal.

BACKGROUND ART

A rechargeable battery, that is, battery, is widely used as an energy source for a mobile device such as a smartphone. In addition, the battery is also used as an energy source for an eco-friendly vehicle, such as an electric vehicle and a hybrid electric vehicle, which is suggested as a way to solve air pollution caused by a gasoline vehicle and a diesel vehicle using fossil fuels. The types of applications using the battery are diversifying, and it is expected that the battery will be applied to more fields and products in the future than now.

The electrical or electronic device, etc. that uses a battery as power should be equipped with a battery management system (BMS), etc. to control an operation of the battery. The BMS may monitor a state such as temperature, voltage, or current of the battery, and may control balancing of the battery and charging or discharging of the battery through state of charge (SOC) estimation based on the monitored state of the battery. The BMS may include a battery monitoring integrated circuit (BMIC) for monitoring a state of the battery and a main control circuit (MCU) for controlling the battery according to the state of the battery. The BMIC measures status information such as voltage, current, or temperature for the battery, generates a diagnostic signal from the measured status information, and transfers it to the main control circuit (MCU). Further, the main control circuit (MCU) may receive a diagnostic signal from the BMIC to monitor the state of the battery, and control the battery according to the state of the battery.

Meanwhile, if the voltage of the battery is lower or higher than a set voltage, it is necessary to control power supplied from the battery to the electrical or electronic device. That is, when it is diagnosed that the voltage of the battery is a voltage such as an under cell voltage lower than the set voltage or an over cell voltage higher than the set voltage, a predetermined control signal is output to control the function of the battery. For example, if a battery that maintains a voltage of 3 V to 4.1 V outputs a voltage of 4.5 V, a voltage determination unit diagnoses it as the over cell voltage higher than the set voltage to output a predetermined control signal, and controls a function such as turning off communication, according to the control signal, and stop the operation of the battery.

Conventionally, a voltage determination unit that determines whether or not the battery voltage is abnormal is provided in the MCU or BMIC to internally determine the battery voltage within the MCU or BMIC and output a control signal. Here, the voltage determination unit implemented within the MCU or the BMIC is implemented as software. However, in this conventional method, since the voltage determination unit is implemented in software within the MCU or BMIC, it is dependent on the MCU or the BMIC, and various countermeasures for defects are required, thereby increasing the price of the MCU or BMIC.

Such related art includes the following patent document. Korean Unexamined Patent Publication No. 10-2021-0092013

DISCLOSURE OF THE INVENTION

Technical Problem

The present invention provides a voltage determination circuit capable of determining whether or not a voltage supplied from a voltage supply unit is abnormal.

The present invention provides a voltage determination circuit capable of determining whether or not a supply voltage is abnormal using a predetermined circuit.

The present invention provides a voltage determination circuit capable of determining whether or not a voltage is abnormal within the MCU or BMIC and determining it using a predetermined circuit.

Technical Solution

A voltage determination circuit according to an aspect of the present invention includes a voltage supply unit that supplies a predetermined voltage, a first switch that receives the supply voltage to turn on according to a first threshold voltage, a second switch that receives the supply voltage to turn on according to a second threshold voltage, and a third switch that receives an output of the second switch to turn on according to a third threshold voltage.

The first and third switches are output to an output terminal, and the second switch is output to an input of the third switch.

The first and third switches are P-channel metal-oxide-semiconductor field-effect transistors (PMOSFETs), and the second switch is an N-channel MOSFET (NMOSFET).

The first to third threshold voltages are different from each other.

The first to third threshold voltages are adjusted according to a set voltage range.

The first threshold voltage is less than a lower limit of the set voltage range, the third threshold voltage is a predetermined voltage within the set voltage range, and the second threshold voltage is greater than an upper limit of the set voltage range.

A voltage determination circuit according to another aspect of the present invention includes a voltage supply unit that provides a supply voltage, a first voltage determination unit that primarily determines the supply voltage and a set voltage range to output it to an output terminal, and a second voltage determination unit that secondarily determines the supply voltage and a set voltage range using the supply voltage and an output signal of the first voltage determination unit to output it to an output terminal.

The voltage supply unit includes a battery having a plurality of chargeable and dischargeable battery cells.

The first voltage determination unit is implemented in any one of a battery monitoring integrated circuit (BMIC) for monitoring a state of the battery and a main control unit (MCU) for controlling the battery according to a state of the battery.

The second voltage determination unit is provided in a predetermined area of the BMS except for the BMIC and the MCU.

A level of the output terminal is determined by adding an output level of the first voltage determination unit and an output level of the second voltage determination unit.

The output terminal maintains a low level when the supply voltage is within the set voltage range and maintains a high level when the supply voltage is outside the set voltage range.

The second voltage determination unit includes a first switch that receives the supply voltage to turn on according to a first threshold voltage, a second switch that receives the supply voltage to turn on according to a second threshold voltage, and a third switch that receives the supply voltage to turn on according to a third threshold voltage.

The first and third switches are output to the output terminal, and the second switch is output to an input of the third switch.

The first and third switches are P-channel metal-oxide-semiconductor field-effect transistors (PMOSFETs), and the second switch is an N-channel MOSFET (NMOSFET).

The first to third threshold voltages are different from each other.

The first to third threshold voltages are adjusted according to the set voltage range.

The first threshold voltage is less than a lower limit of the set voltage range, the second threshold voltage is greater than an upper limit of the set voltage range, and the third threshold voltage is a predetermined voltage within the set voltage range.

Advantageous Effects

In the present invention, the supply voltage from the voltage supply unit is applied to the first voltage determination unit, and the first voltage determination unit primarily determines whether or the supply voltage is within a set voltage range, and outputs a signal of a predetermined level to the output terminal. In addition, the second voltage determination unit receives an output signal according to the supply voltage of the voltage supply unit and the determination result of the first voltage determination unit, and secondarily determines whether or not the supply voltage is outside the set voltage range, to output a signal of a predetermined level to the output terminal. In this case, the second voltage determination unit may include a plurality of switches and adjust the range of the set voltage by adjusting the threshold voltages of the switches.

Therefore, in the present invention, since the second voltage determination unit is implemented in hardware rather than within the MCU or BMIC, there is an advantage in that a process of determining whether or not the voltage is abnormal is simple. Further, since the second voltage determination unit is implemented in hardware rather than in the MCU or BMIC, it is not dependent on the MCU or the BMIC, and various countermeasures for defects are not required, thereby lowering the price of the MCU or the BMIC compared to that of the related art.

MODE FOR CARRYING OUT THE INVENTION

Hereinafter, embodiments of the present invention will be described in detail with reference to the accompanying drawings. However, the present invention is not limited to the embodiments disclosed below, but will be implemented in various different forms. The embodiments of the present invention are provided only to complete the disclosure of the present invention, and to fully inform those of ordinary skill in the scope of the present invention.

Figure 1:
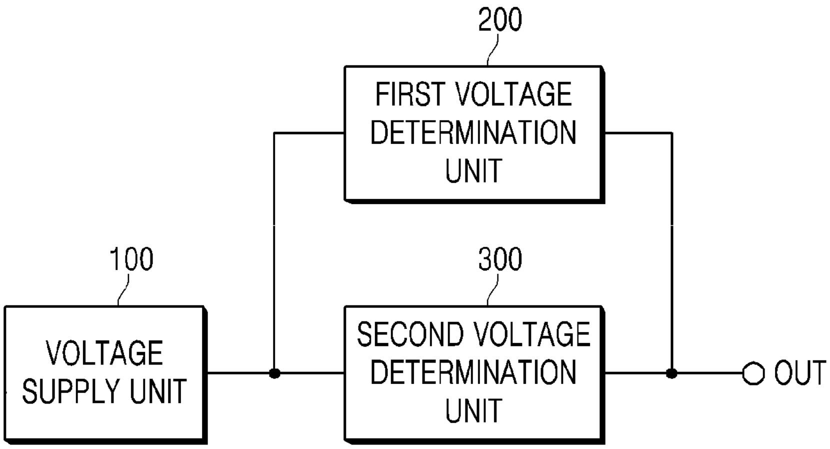
FIGS. 1 and 2 are block diagrams of a voltage determination circuit according to an embodiment of the present invention.
Figure 2:
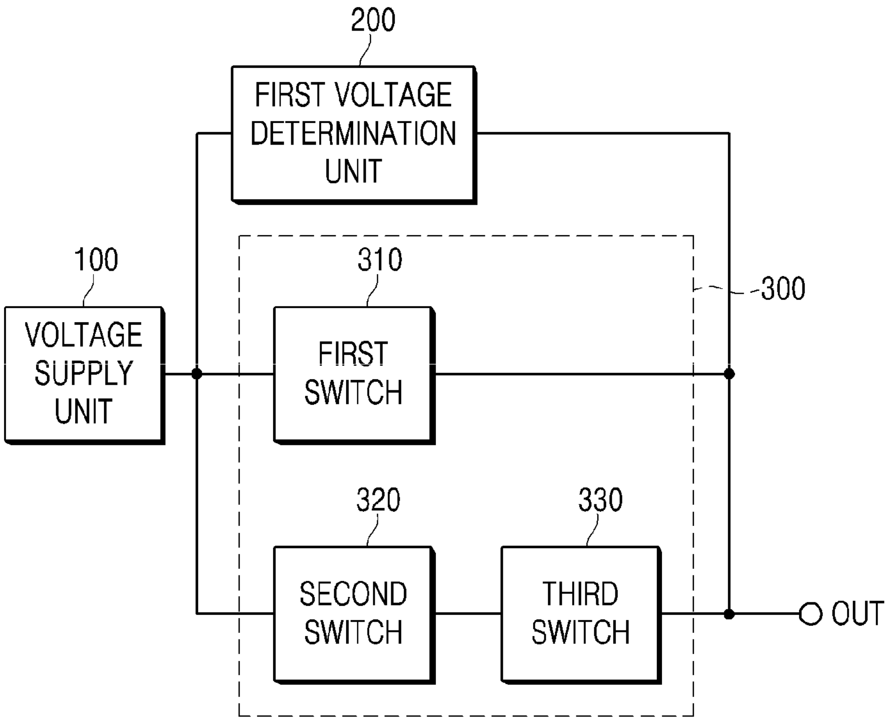
Figure 3:
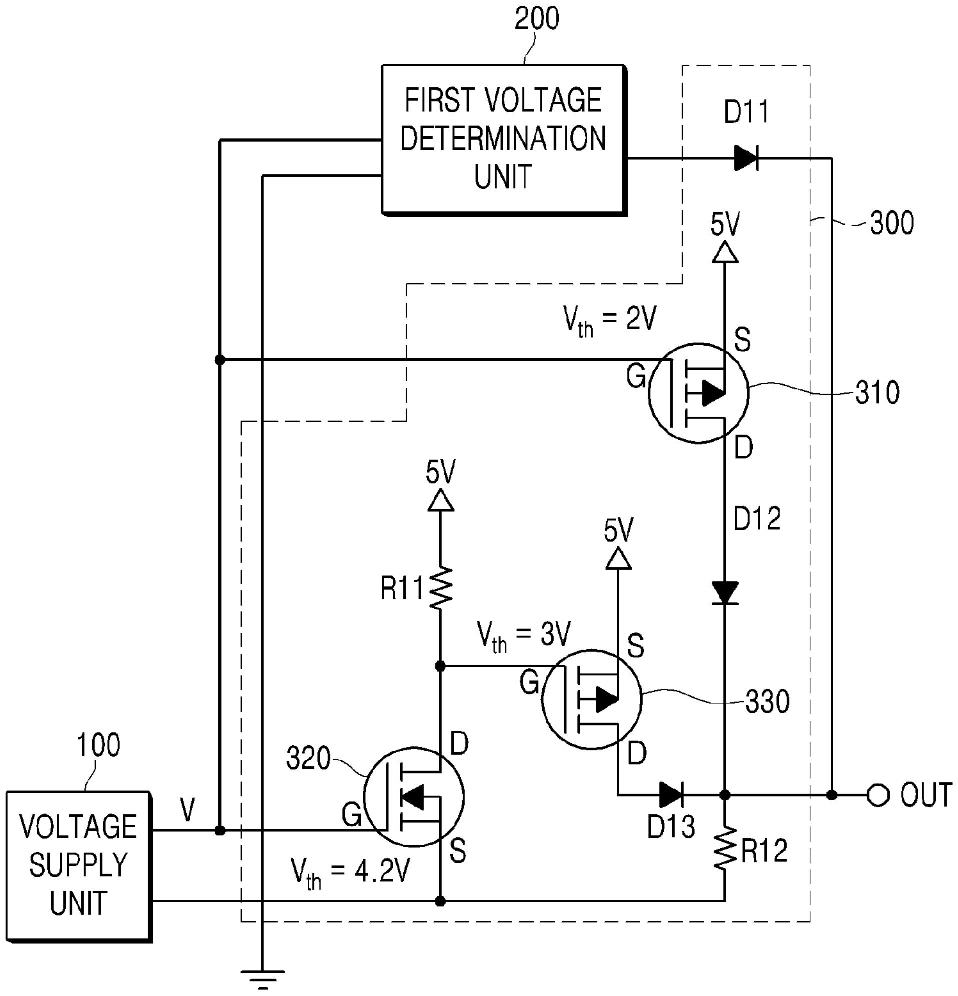
FIG. 3 is a circuit diagram of the voltage determination circuit according to an embodiment of the present invention.

FIGS. 1 and 2 are block diagrams for describing a configuration of a voltage determination circuit according to an embodiment of the present invention, and FIG. 3 is a circuit diagram of the voltage determination circuit according to the embodiment of the present invention.

Referring to FIGS. 1 to 3, the voltage determination circuit according to an embodiment of the present invention may include a voltage supply unit 100 that supplies power of a predetermined voltage, a first voltage determination unit 200 that determines whether or not a voltage supplied from the voltage supply unit 100 is within a set voltage, and a second voltage determination unit 300 that determines whether or not the voltage supplied from the voltage supply unit 100 is within the set voltage using the voltage supplied from the voltage supply unit 100 and an output signal of the first voltage determination unit 200. That is, the first voltage determination unit 200 primarily determines whether or not the supply voltage is within the set voltage, and the second voltage determination unit 300 secondarily determines whether or not the supply voltage is within the set voltage using the determination result of the first voltage determination unit 200 and the supply voltage. Here, the first voltage determination unit 200 may be implemented in software, and the second voltage determination unit 300 may be implemented in hardware. Therefore, it is possible to reduce software dependence and to reliably determine whether or not the supply voltage is abnormal. The voltage determination circuit according to the embodiment of the present invention will be described in more detail for each configuration as follows.

The voltage supply unit 100 supplies power of a predetermined voltage. The voltage supply unit 100 may include a chargeable/dischargeable battery. Of course, the voltage supply unit 100 may include a device for supplying power of a predetermined voltage in addition to the battery. For example, it may include a power supply device that receives external alternating current (AC) power to generate and supply a predetermined direct current (DC) voltage necessary for driving the inside of the electrical or electronic device. The battery can be charged and discharged, and can provide electrical energy of a predetermined voltage required for driving the electrical or electronic device. That is, the battery may be charged to store electric energy of a predetermined capacity, and discharged to provide electric energy for operation of the electric and electronic device. Such a battery may include a plurality of battery modules, and the battery module may include a plurality of chargeable and dischargeable battery cells. That is, the battery module may be formed by including a plurality of battery cells, and a plurality of battery cells may be bundled into a predetermined unit to form the battery module, and the plurality of battery modules may form one battery. Meanwhile, the plurality of battery cells may be connected in series and/or in parallel in various ways so as to conform to specifications of the electrical or electronic device. Of course, a plurality of battery packs each including a plurality of battery cells may also be connected in series and/or in parallel. Here, the type of the battery cell is not particularly limited, and may include, for example, a lithium ion battery, a lithium polymer battery, a nickel cadmium battery, a nickel hydride battery, a nickel zinc battery, etc.

The first voltage determination unit 200 may generate a control signal by determining whether or not the voltage supplied from the voltage supply unit 100 is within a set voltage range. That is, the first voltage determination unit 200 may compare the voltage supplied from the voltage supply unit 100 with the set voltage to output a comparison result. The first voltage determination unit 200 may compare the supply voltage with the set and output signals of different levels according to the comparison result. For example, the first voltage determination unit 200 outputs a low level signal when the supply voltage is within the set voltage range, and outputs a high level signal when the supply voltage is out of the set voltage range. As a specific example, the supply voltage from the voltage supply unit 100 may be set to 3 V to 4.2 V, and the first voltage determination unit 200 may determine whether the voltage supplied from the voltage supply unit 100 is within 3 V to 4.2 V or not. The first voltage determination unit 200 may output the low level signal when the supply voltage is between 3 V and 4.2 V, and output a high level signal when it is less than 3 V or exceeds 4.2 V. Meanwhile, the first voltage determination unit 200 may be a part of the BMS when the voltage supplying unit 100 is a battery. That is, the BMS may monitor the state such as temperature, voltage, and current of the battery, and may control balancing of the battery and charging or discharging of the battery through state of charge (SOC) estimation based on the monitored state of the battery. The BMS may include a battery monitoring IC (BMIC) for monitoring a state of the battery and a main control circuit (MCU) for controlling the battery according to the state of the battery. The BMIC measures status information such as voltage, current, and temperature for the battery, generates a diagnostic signal from the measured status information, and transfers it to the main control circuit (MCU). Further, the main control circuit (MCU) may receive the diagnostic signal from the BMIC to monitor the state of the battery, and control the battery according to the state of the battery. In this case, the first voltage determination unit 200 may be provided in the BMIC or may be provided in the main control circuit. Further, the first voltage determination unit 200 may be implemented in software. Meanwhile, a first diode D11 may be provided between the first voltage determination unit 200 and an output terminal OUT.

The second voltage determination unit 300 determines whether the voltage supplied from the voltage supply unit 100 is out of the set voltage range and outputs a predetermined control signal. Further, the second voltage determination unit 300 may be implemented in a predetermined area of the BMS except for the BMIS and MCU. The second voltage determination unit 300 may include a plurality of switches 310, 320, and 330, and the plurality of switches may respectively include transistors having different threshold voltages. For example, as illustrated in FIG. 2, it may include a first switch 310 of which a gate terminal is connected to an output terminal of the voltage supply unit 100 and a drain terminal is connected to the output terminal OUT, a second switch 320 of which a gate terminal is connected to the output terminal of the voltage supply unit 100 and a source terminal is connected to the output terminal OUT, and a third switch 330 of which a gate terminal is connected to an output terminal of the second switch 320 and a source terminal is connected to the output terminal OUT. Here, the first switch 310 may be a PMOSFET, the second switch 320 may be an NMOSFET, and the third switch 330 may be a PMOSFET. In the first switch 310 (i.e., a first PMOSFET), the gate terminal thereof is connected to the output terminal of the voltage supply unit 100, a source terminal thereof is connected to a power terminal of 5 V, and the drain terminal thereof is connected to the output terminal OUT. In the second switch 320 (i.e., NMOSFET), the gate terminal thereof is connected to the output terminal of the voltage supply unit 100, the source terminal thereof is connected to an output terminal OUT, and a drain terminal thereof is connected to the gate terminal of the third switch 330 (i.e., a second PMOSFET). In the third switch 330 (i.e., a second PMOSFET), the gate terminal thereof is connected to a drain terminal of the second switch 320, the source terminal thereof is connected to a power terminal of 5 V, and a drain terminal thereof is connected to the output terminal OUT. Here, the first to third switches 310, 320, and 330 may have different threshold voltages. Two of the first to third switches 310, 320, and 330 may have threshold voltages of a lower limit voltage and an upper limit voltage of the set voltage range, and the other may have a lower threshold voltage than the lower limit voltage of the set voltage range. For example, the first switch 310 may have a threshold voltage of 2 V, the second switch 320 may have a threshold voltage of 4.2 V, and the third switch 330 may have a threshold voltage of 3 V. The first switch 310 has a first threshold voltage of 2 V, receives an output voltage from the voltage supply unit 100 as a gate voltage, and outputs a signal according to the difference between a source voltage Vs1 and a gate voltage Vg1 to the output terminal OUT. If the difference is greater than the first threshold voltage, the first switch 310 outputs a high level signal. The second switch 320 has a second threshold voltage of 4.2 V, receives the output voltage from the voltage supply unit 100 as a gate voltage, and outputs a signal according to the difference between a source voltage Vs2 and a gate voltage Vg2 to the gate of the third switch 330. The third switch 330 has a third threshold voltage of 3 V, receives a drain voltage Vd of the second switch 320 as a gate voltage, and outputs a signal to the output terminal OUT according to the comparison between the difference between a source voltage Vs3 and a gate voltage Vg3 and the third threshold voltage. The second voltage determination unit 300 having such a configuration outputs a low level signal to the output terminal OUT when the voltage supplied from the voltage supply unit 100 is within the set voltage range, and outputs a high level signal to the output terminal OUT if it is out of the set voltage range. In this way, since the plurality of switches have a threshold voltage of the set voltage range and a threshold voltage lower than the lower limit voltage of the set voltage, it is possible to detect that the voltage from the voltage supply unit 100 is out of the set voltage. In addition, when the set voltage is changed, the threshold voltage of the switches may be changed, so that it is possible to respond to the change in the set voltage. Meanwhile, a second diode D12 may be provided between the drain terminal of the first switch 310 and the output terminal OUT, and a third diode D13 may be provided between the drain terminal of the third switch 330 and the output terminal OUT. Further, a first resistor R11 may be provided between the drain terminal of the second switch 320 and the power terminal of 5 V, and a second resistor R12 may be provided between the source terminal of the second switch 320 and the output terminal OUT.

A method for driving the voltage determination circuit of the present invention as described above will be described by taking a set voltage of 3 V to 4.2 V as an example. That is, when the voltage supplied from the voltage supply unit is 3 V to 4.2 V, an electrical or electronic operates normally, and in a voltage range other than that, it is possible to notify a fault situation or control a function. In this case, a case in which the voltage supply unit supplies voltages of 2 V, 3.7 V, and 5 V in a circuit that operates normally in the set voltage range of 3 V to 4.2 V will be described.

First, when a voltage of 2 V is output from the voltage supply unit 100, the first voltage determination unit 200 receives the voltage of 2 V and compares it with the set voltage of 3 V to 4.2 V, determines that the voltage of 2 V is out of the set voltage, and outputs a high level signal. In addition, the voltage of 2 V is input to the second voltage determination unit 300, and the first switch 310 receives the voltage of 2 V to the gate terminal thereof. In this case, in the first switch 310, a power voltage of 5 V is applied to the source terminal thereof and the voltage of 2 V is applied to the gate terminal thereof and thus, the difference between the source voltage Vs1 and the gate voltage Vg1 is 3 V and is higher than the threshold voltage of 2 V, so that the first switch 310 is turned on (Vs1−Vg1=3 V>Vth). Accordingly, the drain terminal of the first switch 310 becomes a high level. In addition, in the second switch 320, the voltage of 2 V is applied to the gate terminal and the difference between the gate voltage Vg2 and the source voltage Vs2 is 2 V and the threshold voltage is 4.2 V, and thus the difference between the gate voltage Vg2 and the source voltage Vs2 is lower than the threshold voltage (Vg2−Vs2=2 V<Vth). Accordingly, the second switch 320 is turned off and the drain terminal maintains a high level (5 V). The drain terminal of the second switch 320 maintains the high level (5 V), and thus a high level (5 V) signal is applied to the gate terminal of the third switch 330. Accordingly, in the third switch 330, the difference between the source voltage Vs3 and the gate voltage Vg3 is 0 V, which is lower than the threshold voltage (Vs3−Vg3=0V<Vth), and thus the third switch 330 is turned off. As a result, the second voltage determination unit 300 outputs the high level signal applied to the drain terminal of the first switch 310. However, the first voltage determination unit 200 outputs the high level signal, and thus the output terminal OUT maintains a high level. As a result, the output terminal OUT of the voltage determination circuit according to the present invention becomes a high level, and this makes it determined that the supply voltage of the voltage supply unit 100 is supplied as an abnormal signal.

When a voltage of 3.7 V is output from the voltage supply unit 100, the first voltage determination unit 200 receives the voltage of 3.7 V and compares it with the set voltage of 3 V to 4.2 V, determines that the voltage of 3.7 V is within the set voltage, and outputs a low level signal. In addition, the voltage of 3.7 V is applied to the second voltage determination unit 300, and the first switch 310 receives the voltage of 3.7 V to the gate terminal thereof. In this case, in the first switch 310, the power voltage of 5 V is applied to the source terminal and the voltage of 3.7 V is applied to the gate terminal and thus, the difference between the source voltage Vs1 and the gate voltage Vg1 is 1.3 V and is lower than the threshold voltage of 2 V, so that the first switch 310 is turned off (Vs1−Vg1=1.3 V<Vth). Accordingly, the drain terminal of the first switch 310 becomes a low level. In addition, in the second switch 320, the voltage of 3.7 V is applied to the gate terminal and the difference between the gate voltage Vg2 and the source voltage Vs2 is 3.7 V and the threshold voltage is 4.2 V, and thus the difference between the gate voltage Vg2 and the source voltage Vs2 is lower than the threshold voltage (Vg2−Vs2=3.7 V<Vth). Accordingly, the second switch 320 is turned off and the drain terminal maintains a high level (5 V). The drain terminal of the second switch 320 maintains the high level (5 V), and thus the high level (5 V) signal is applied to the gate terminal of the third switch 330. Accordingly, in the third switch 330, the difference between the source voltage Vs3 and the gate voltage Vg3 is 0 V, which is lower than the threshold voltage (Vs3−Vg3=0V<Vth), and thus the third switch 330 is turned off. As a result, the second voltage determination unit 300 outputs the low level signal. However, the first voltage determination unit 200 outputs the low level signal, and thus the output terminal OUT maintains the low level. As a result, the output of the voltage determination circuit according to the present invention becomes the low level, and this makes it determined that the supply voltage of the voltage supply unit 100 is supplied as normal signal.

When a voltage of 5 V is supplied from the voltage supply unit 100 and applied to the first voltage determination unit 200, the first voltage determination unit 200 determines that the voltage of 5 V is out of the set voltage of 3 V to 4.2 V, and outputs a high level signal. In addition, the voltage of 5 V is applied to the second voltage determination unit 300, and the first switch 310 receives the voltage of 5 V to the gate terminal thereof. In this case, in the first switch 310, the power voltage of 5 V is applied to the source terminal thereof and the voltage of 5 V is applied to the gate terminal thereof and thus, the difference between the source voltage Vs1 and the gate voltage Vg1 is 0 V and is lower than the threshold voltage of 2 V, so that the first switch 310 is turned off (Vs1−Vg1=0 V<Vth). In addition, in the second switch 320, the voltage of 5 V is applied to the gate terminal thereof and the difference between the gate voltage Vg2 and the source voltage Vs2 is 5 V and the threshold voltage is 4.2 V, and thus the difference between the gate voltage Vg2 and the source voltage Vs2 is higher than the threshold voltage (Vg2−Vs2=5 V>Vth). Accordingly, the second switch 320 is turned on and the drain terminal maintains a low level. The drain terminal of the second switch 320 maintains the low level, and thus a low level signal is applied to the gate terminal of the third switch 330. Accordingly, in the third switch 330, the difference between the source voltage Vs3 and the gate voltage Vg3 is 5 V, which is higher than the threshold voltage (Vs3−Vg3=5V>Vth), and thus the third switch 330 is turned on and the drain terminal maintains the high level. As a result, the second voltage determination unit 300 outputs the high level signal. In this case, the first voltage determination unit 200 outputs the high level signal, and thus the output terminal OUT maintains the high level. As a result, the output of the voltage determination circuit becomes the high level, and this makes it determined that the supply voltage of the voltage supply unit 100 is supplied as an abnormal signal.

As described above, in the present invention, a predetermined voltage is applied to the first voltage determination unit 200 from the voltage supply unit 100, and the first voltage determination unit 200 primarily determines whether or not the supply voltage is within the set voltage range to output a signal of a predetermined level to the output terminal OUT. Further, the second voltage determination unit 300 receives the supply voltage of the voltage supply unit 100 and the output signal according to the determination result of the first voltage determination unit 200, and secondarily determines whether or not the supply voltage is out of the set voltage range to output a signal of a predetermined level to the output terminal OUT. For example, the first voltage determination unit 200 outputs a low level signal when the voltage of the voltage supply unit 100 is within the set voltage range, and outputs a high level signal when it is out of the set voltage range. Further, the second voltage determination unit 200 outputs a low level signal when the voltage of the voltage supply unit 100 is within the set voltage range, and outputs a high level signal when it is out of the set voltage range. The output terminal OUT maintains the low or high level according to the output signals of the first and second voltage determination units 200 and 300. In this case, the range of the set voltage may be adjusted by adjusting the threshold voltages of the switches 310, 320, and 330 of the second voltage determination unit 300. Therefore, in the present invention, since the second voltage determination unit is implemented in hardware rather than in the MCU or BMIC, there is an advantage in that the process of determining whether or not the voltage is abnormal is simple. In addition, since the second voltage determination unit is implemented in hardware rather than in the MCU or BMIC, it is not dependent on the MCU or the BMIC, and various countermeasures for defects are not required, thereby lowering the price of the MCU or the BMIC compared to that of the related art.

That is, the present invention alleviates software dependence compared to the related art, in which diagnosis is performed by software of MCU or BMIC, by configuring the configuration for performing self-diagnosis through a signal output circuit according to the voltage range in hardware. Accordingly, it is possible to prepare for an abnormality in the MCU or the BMIC.

Although the technical idea of the present invention as described above has been specifically described according to the embodiment described above, it should be noted that the above embodiment is for description and not for limitation. In addition, those skilled in the art will understand that various embodiments are possible within the scope of the technical spirit of the present invention.

The symbols used in the drawings for this invention are as follows.

100: VOLTAGE SUPPLY UNIT
200: FIRST VOLTAGE DETERMINATION UNIT
300: SECOND VOLTAGE DETERMINATION UNIT
310: FIRST SWITCH
320: SECOND SWITCH
330: THIRD SWITCH

What is claimed is:

1. A voltage determination circuit comprising:
a voltage supply unit that provides a supply voltage;
a first voltage determination unit that determines whether the supply voltage is within a set voltage range and outputs a first output signal to an output terminal; and
a second voltage determination unit that comprises a plurality of switches and outputs a second output signal to the output terminal based on an operation of the plurality of switches according to the supply voltage,
wherein the voltage supply unit comprises a battery, and
wherein the first voltage determination unit is implemented in any one of a battery monitoring integrated circuit (BMIC) for monitoring a state of the battery and a main control unit (MCU) for controlling the battery according to the state of the battery.

2. The voltage determination circuit of claim 1, wherein the battery includes a plurality of chargeable and dischargeable battery cells.

3. The voltage determination circuit of claim 1, wherein the second voltage determination unit is provided in a predetermined area of a battery management system (BMS) except for the BMIC and the MCU.

4. The voltage determination circuit of claim 1, wherein an output level of the output terminal is determined by adding a level of the first output signal and a level of the second output signal.

5. The voltage determination circuit of claim 4, wherein the output terminal maintains a low level when the supply voltage is within the set voltage range and maintains a high level when the supply voltage is outside the set voltage range.

6. The voltage determination circuit of claim 1, wherein the second voltage determination unit comprises:
a first switch that receives the supply voltage to turn on according to a first threshold voltage,
a second switch that receives the supply voltage to turn on according to a second threshold voltage, and
a third switch that receives an output of the second switch to turn on according to a third threshold voltage.

7. The voltage determination circuit of claim 6, wherein the first and third switches are output to the output terminal, and the second switch is output to an input of the third switch.

8. The voltage determination circuit of claim 7, wherein the first and third switches are P-channel metal-oxide semiconductor field-effect transistors (PMOSFETs), and the second switch is an N-channel MOSFET (NMOSFET).

9. The voltage determination circuit of claim 8, wherein the first to third threshold voltages are different from each other.

10. The voltage determination circuit of claim 9, wherein the first to third threshold voltages are adjusted according to the set voltage range.

11. The voltage determination circuit of claim 10, wherein the first threshold voltage is less than a lower limit of the set voltage range, the second threshold voltage is greater than an upper voltage determination limit of the set voltage range, and the third threshold voltage is a predetermined voltage within the set voltage range.

12. A voltage determination circuit comprising:
a voltage supply unit that provides a supply voltage;
a first voltage determination unit that determines whether the supply voltage and ais within a set voltage range and outputs a first output signal to an output terminal; and
a second voltage determination unit that comprises a plurality of switches and outputs a second output signal to the output terminal based on an operation of the plurality of switches according to the supply voltage,
wherein the second voltage determination unit comprises:
a first switch that receives the supply voltage to turn on according to a first threshold voltage,
a second switch that receives the supply voltage to turn on according to a second threshold voltage, and
a third switch that receives an output of the second switch to turn on according to a third threshold voltage.

13. The voltage determination circuit of claim 12, wherein the second voltage determination unit further comprises a plurality of resistors.

14. The voltage determination circuit of claim 12, wherein the second voltage determination unit further comprises a plurality diodes.

* * * * *